United States Patent
Snai et al.

(10) Patent No.: US 10,581,385 B2
(45) Date of Patent: Mar. 3, 2020

(54) LOW-NOISE AMPLIFIER (LNA) TRANSFORMER NOTCH

(71) Applicant: QUALCOMM Incorporated, San Diego, CA (US)

(72) Inventors: Makar Snai, Burdwan (IN); Manohar Seetharam, Bangalore (IN); Ehab Abdel Ghany, San Diego, CA (US); Vinod Panikkath, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/519,877

(22) Filed: Jul. 23, 2019

(65) Prior Publication Data

US 2020/0036345 A1 Jan. 30, 2020

Related U.S. Application Data

(63) Continuation of application No. 16/047,563, filed on Jul. 27, 2018, now Pat. No. 10,419,045.

(51) Int. Cl.
*H03F 1/26* (2006.01)
*H04B 1/16* (2006.01)
*H03F 3/193* (2006.01)
*H04B 1/10* (2006.01)

(52) U.S. Cl.
CPC ............... *H03F 1/26* (2013.01); *H03F 3/193* (2013.01); *H04B 1/16* (2013.01); *H03F 2200/294* (2013.01); *H03F 2200/451* (2013.01); *H04B 2001/1063* (2013.01)

(58) Field of Classification Search
CPC .. H03H 7/38; H03H 7/0153; H03H 2007/013; H03H 7/42; H04B 3/16; H04B 1/0475; H04B 1/0071; H04B 1/1036; H04B 1/18; H04B 1/04; H04B 1/00; H04B 1/10; H04B 1/16; H04B 2001/1063; H03F 2200/451; H03F 2200/294
See application file for complete search history.

(56) References Cited

U.S. PATENT DOCUMENTS

| 8,018,292 B2 | 9/2011 | Wachi et al. |
| 8,736,392 B2 | 5/2014 | Taghivand et al. |
| 9,543,995 B1 | 1/2017 | Fabiano et al. |
| 2006/0097811 A1 | 5/2006 | Nakamura et al. |
| 2010/0136942 A1 | 6/2010 | Lee et al. |

(Continued)

*Primary Examiner* — Rahel Guarino
(74) *Attorney, Agent, or Firm* — Patterson & Sheridan, L.L.P.

(57) ABSTRACT

Certain aspects of the present disclosure are directed to a circuit for signal processing. The circuit generally includes a first transformer having a first inductive element magnetically coupled with a second inductive element, and a second transformer having a third inductive element magnetically coupled with a fourth inductive element, wherein the first inductive element is coupled in series with the third inductive element. In certain aspects, the circuit also includes a first switch coupled in parallel with the third inductive element, a capacitive element coupled in parallel with the fourth inductive element, wherein a notch is formed at least by the capacitive element and the fourth inductive element, the notch circuit coupled in series with the second inductive element, and a second switch coupled in parallel with the fourth inductive element.

26 Claims, 11 Drawing Sheets

(56) References Cited

U.S. PATENT DOCUMENTS

| | | |
|---|---|---|
| 2014/0347142 A1 | 11/2014 | Chang et al. |
| 2015/0214900 A1* | 7/2015 | Horng .................. H03F 1/26 |
| | | 330/291 |
| 2016/0112146 A1 | 4/2016 | Lau et al. |
| 2017/0005630 A1 | 1/2017 | Stampalia et al. |

* cited by examiner

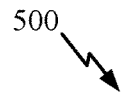

502

RECEIVE AN INPUT CURRENT FLOWING IN A FIRST SIGNAL PATH, WHEREIN THE FIRST SIGNAL PATH COMPRISES A FIRST INDUCTIVE ELEMENT COUPLED IN SERIES WITH A SECOND INDUCTIVE ELEMENT

504

GENERATE AN OUTPUT CURRENT FLOWING IN A SECOND SIGNAL PATH, WHEREIN THE SECOND SIGNAL PATH COMPRISES A THIRD INDUCTIVE ELEMENT COUPLED TO A FOURTH INDUCTIVE ELEMENT, THE FIRST INDUCTIVE ELEMENT BEING MAGNETICALLY COUPLED TO THE THIRD INDUCTIVE ELEMENT, AND THE SECOND INDUCTIVE ELEMENT BEING MAGNETICALLY COUPLED TO THE FOURTH INDUCTIVE ELEMENT, WHEREIN THE SECOND SIGNAL PATH HAS A HIGH IMPEDANCE WITH RESPECT TO A FIRST FREQUENCY AS COMPARED TO AN IMPEDANCE OF THE SECOND SIGNAL PATH WITH RESPECT TO A SECOND FREQUENCY, THE SECOND FREQUENCY BEING LOWER THAN THE FIRST FREQUENCY

702
DETERMINE WHETHER A FIRST MODE OF OPERATION ASSOCIATED WITH A FIRST FREQUENCY BAND OR A SECOND MODE OF OPERATION ASSOCIATED WITH A SECOND FREQUENCY BAND IS ACTIVE

704
CONTROL A FIRST SWITCH AND SECOND SWITCH OF A CIRCUIT FOR SIGNAL PROCESSING BASED ON THE DETERMINATION, THE CIRCUIT COMPRISING: A FIRST TRANSFORMER HAVING A FIRST INDUCTIVE ELEMENT MAGNETICALLY COUPLED WITH A SECOND INDUCTIVE ELEMENT; A SECOND TRANSFORMER HAVING A THIRD INDUCTIVE ELEMENT MAGNETICALLY COUPLED WITH A FOURTH INDUCTIVE ELEMENT, THE FIRST SWITCH BEING COUPLED IN PARALLEL WITH THE THIRD INDUCTIVE ELEMENT, WHEREIN THE FIRST INDUCTIVE ELEMENT IS COUPLED IN SERIES WITH THE THIRD INDUCTIVE ELEMENT WHEN THE FIRST SWITCH IS OPEN; AND A CAPACITIVE ELEMENT COUPLED IN PARALLEL WITH THE FOURTH INDUCTIVE ELEMENT, THE SECOND SWITCH BEING COUPLED IN PARALLEL WITH THE FOURTH INDUCTIVE ELEMENT, WHEREIN A NOTCH CIRCUIT IS FORMED AT LEAST BY THE CAPACITIVE ELEMENT AND THE FOURTH INDUCTIVE ELEMENT WHEN THE SECOND SWITCH IS OPEN, THE NOTCH CIRCUIT BEING IN SERIES WITH THE SECOND INDUCTIVE ELEMENT

FIG. 7

LOW-NOISE AMPLIFIER (LNA) TRANSFORMER NOTCH

CLAIM OF PRIORITY

The present application is a continuation-in-part of U.S. patent application Ser. No. 16/047,563, filed Jul. 27, 2018, which is expressly incorporated by reference herein in its entirety.

TECHNICAL FIELD

Certain aspects of the present disclosure generally relate to electronic circuits and, more particularly, to radio frequency (RF) front-end circuitry.

BACKGROUND

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include radio frequency (RF) front-end circuitry, which may be include one or more transformers for signal processing.

SUMMARY

Certain aspects of the present disclosure are directed to a circuit for signal processing. The circuit generally includes a first transformer having a first inductive element magnetically coupled with a second inductive element, a second transformer having a third inductive element magnetically coupled with a fourth inductive element, wherein the first inductive element is coupled in series with the third inductive element, a first switch coupled in parallel with the third inductive element, a capacitive element coupled in parallel with the fourth inductive element, a notch formed at least by the capacitive element and the fourth inductive element, the notch circuit coupled in series with the second inductive element, and a second switch coupled in parallel with the fourth inductive element.

Certain aspects of the present disclosure are directed to a circuit for signal processing. The circuit generally includes a first inductive element magnetically coupled to a second inductive element, wherein the first inductive element is a primary winding of a first transformer, wherein the second inductive element is a secondary winding of the first transformer, a third inductive element magnetically coupled to a fourth inductive element, wherein the third inductive element is a primary winding of a second transformer, wherein the fourth inductive element is a secondary winding of the second transformer, a first switch coupled between a first terminal of the third inductive element and a second terminal of the third inductive element, a second switch coupled between a first terminal of the fourth inductive element and a second terminal of the fourth inductive element, wherein a first terminal of the first inductive element is coupled to the first terminal of the third inductive element, and wherein a first terminal of the second inductive element is coupled to the first terminal of the fourth inductive element, a second terminal of the second inductive element being coupled to a first output node of the circuit, and the second terminal of the fourth inductive element being coupled to a second output node of the circuit, and a capacitive element coupled between the first terminal and the second terminal of the fourth inductive element.

Certain aspects of the present disclosure are directed to a method for signal processing. The method generally includes determining whether a first mode of operation associated with a first frequency band or a second mode of operation associated with a second frequency band is active, and controlling a first switch and second switch of a circuit for signal processing based on the determination, the circuit comprising a first transformer having a first inductive element magnetically coupled with a second inductive element, a second transformer having a third inductive element magnetically coupled with a fourth inductive element, the first switch being coupled in parallel with the third inductive element, wherein the first inductive element is coupled in series with the third inductive element when the first switch is open, and a capacitive element coupled in parallel with the fourth inductive element, the second switch being coupled in parallel with the fourth inductive element, wherein a notch circuit is formed at least by the capacitive element and the fourth inductive element when the second switch is open, the notch circuit being in series with the second inductive element.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 5 is a flow diagram illustrating example operations for signal processing, in accordance with certain aspects of the present disclosure.

FIG. 7 is a flow diagram illustrating example operations for controlling a circuit for signal processing, in accordance with certain aspects of the present disclosure.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
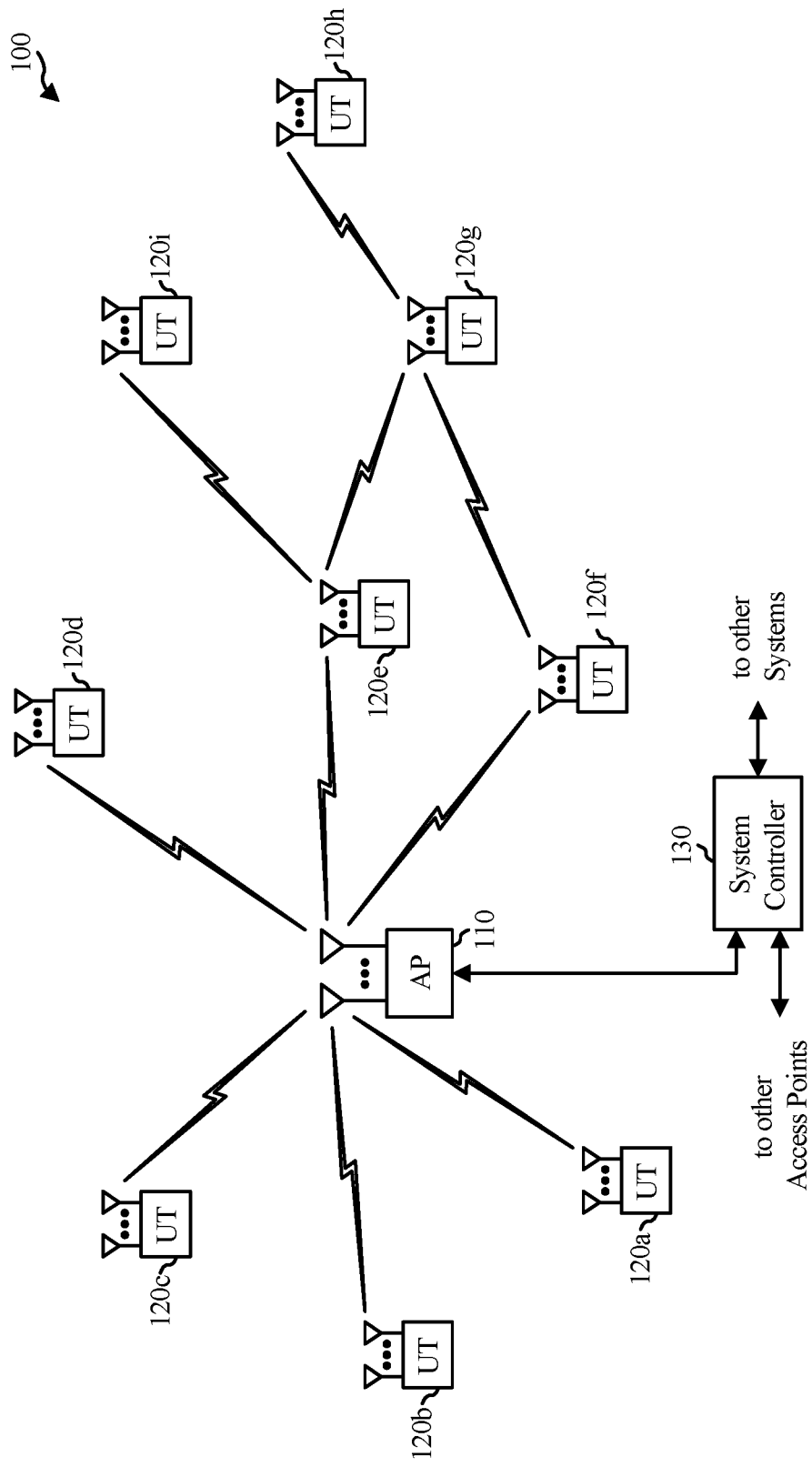
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), gNB, or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported). In certain aspects of the present disclosure, the access point 110 and/or user terminal 120 may include a circuit having transformers for signal processing. The circuit may be implemented with a notch circuit for rejecting certain frequency components of the signal, as described in more detail herein.

Figure 2:
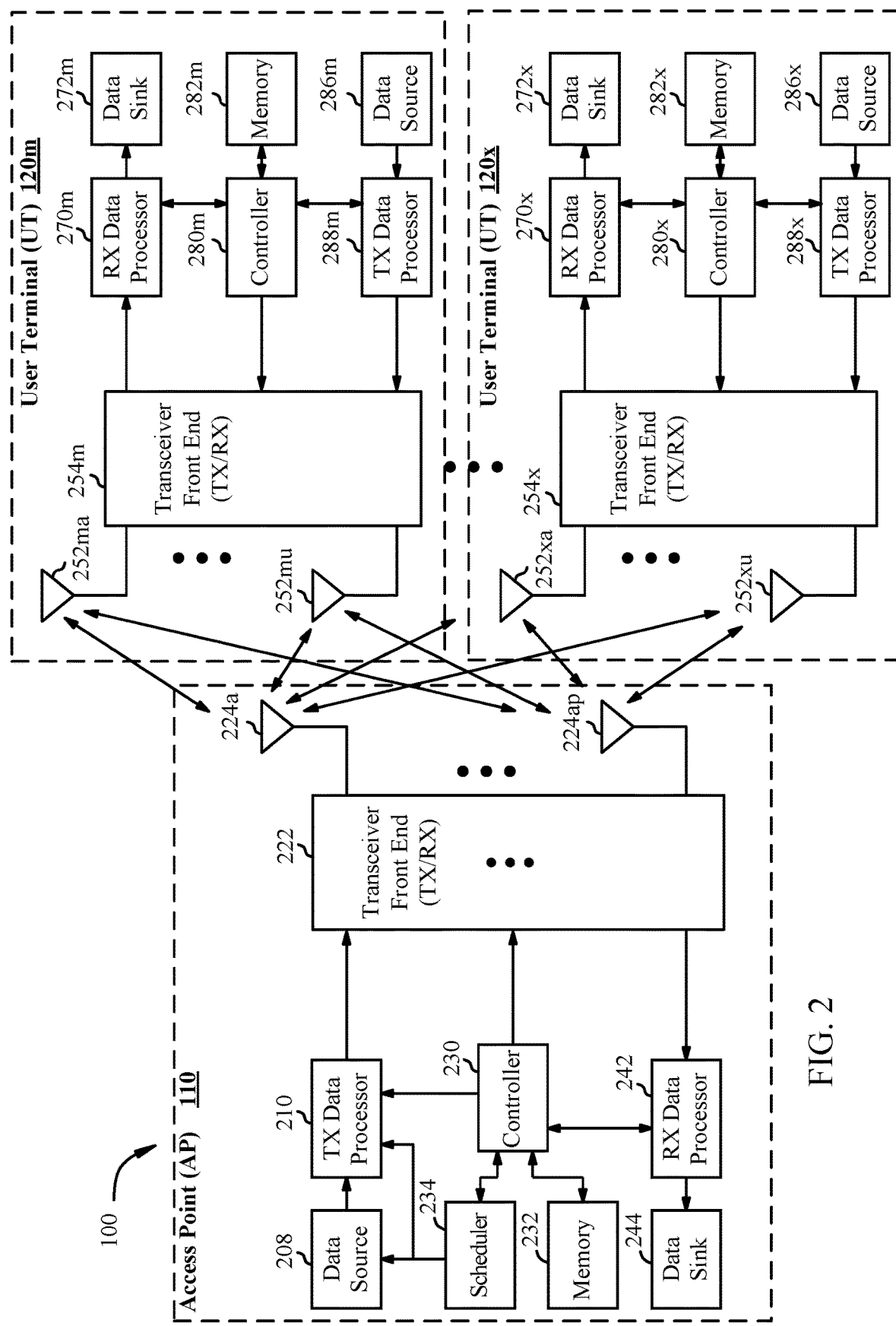
FIG. 2 is a block diagram of an example access point (AP) and example user terminals, in accordance with certain aspects of the present disclosure.

FIG. 2 shows a block diagram of access point 110 and two user terminals 120m and 120x in the wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. The transceiver front end (TX/RX) 222 of access point 110 and/or transceiver front end 254 of user terminal 120 may include a circuit having transformers for signal processing. The circuit may be implemented with a notch circuit for rejecting certain frequency components of the signal, as described in more detail herein.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
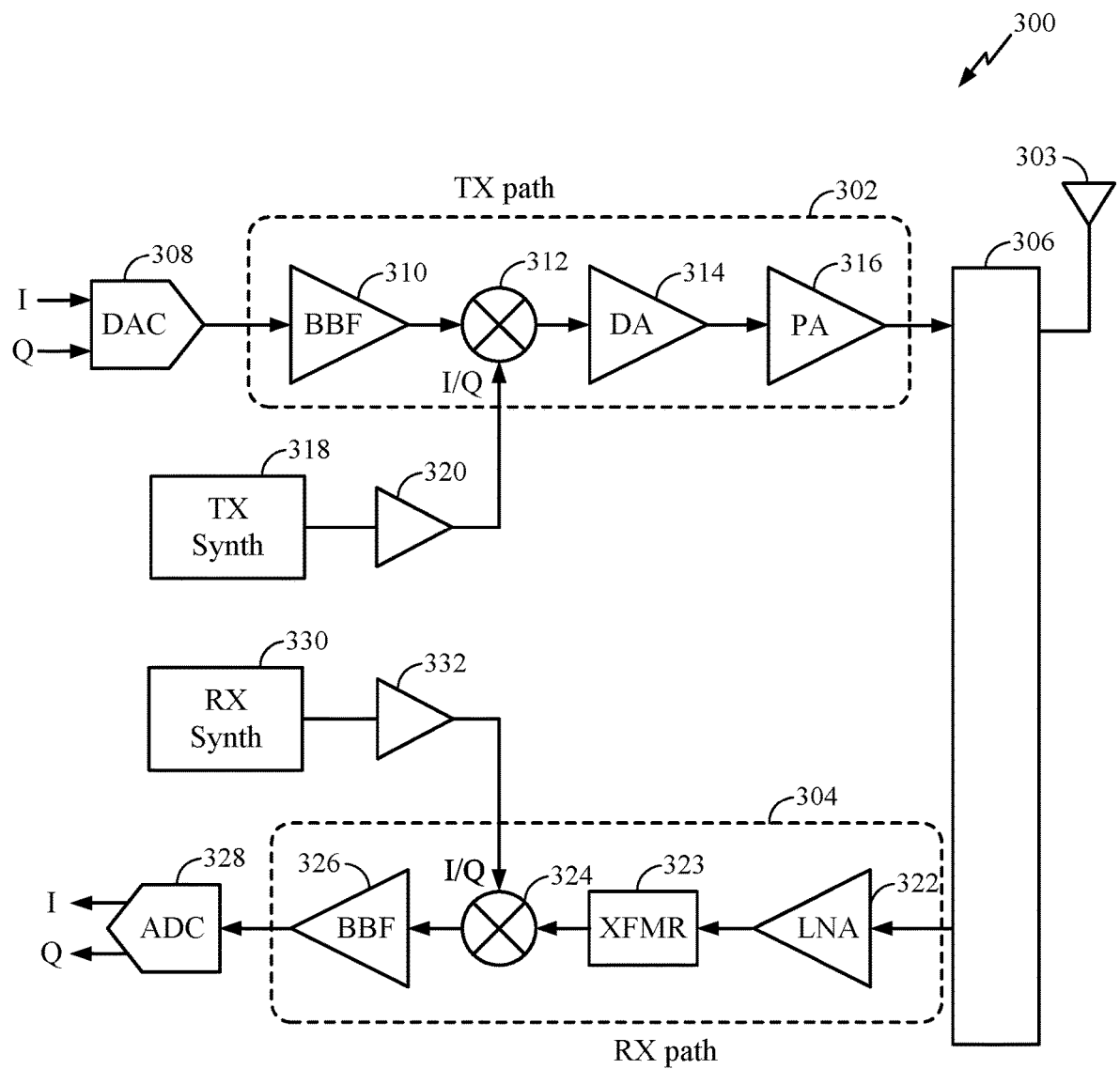
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a transformer circuit 323, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322. In certain aspects, the transformer circuit 323 may include one or more transformers and be implemented using a notch circuit for rejecting certain frequency components of the output signal of the LNA 322, as described in more detail herein. The mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO of the mixer 324 to remain stable in frequency, tuning the LO to different frequencies typically entails using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

Example Transformer Having Improved Jammer Signal Rejection

Receivers being designed for internet of things (IOT) applications or other applications may have to achieve a stringent 64 dBc rejection of the third harmonic of LO signal (3FLO) jammer. Rejection of the 3FLO at the LNA (e.g., LNA 322) output may be low due to low quality factor (Q) of matching components, and transformers, and thus, the desired rejection of 64 dBc may not be achieved. The 3FLO tone at the output of the LNA is down converted to an in-band frequency as a spurious component of the 3FLO signal, and thus, adversely impacts the system performance by degrading signal to noise ratio (SNR) of the receiver (RX) chain. Certain aspects of the present disclosure provide a transformer having improved rejection of jammer signals such as the 3FLO components of an amplified signal at the output of the LNA (e.g., LNA 322 as described with respect to FIG. 3).

Figure 4A:
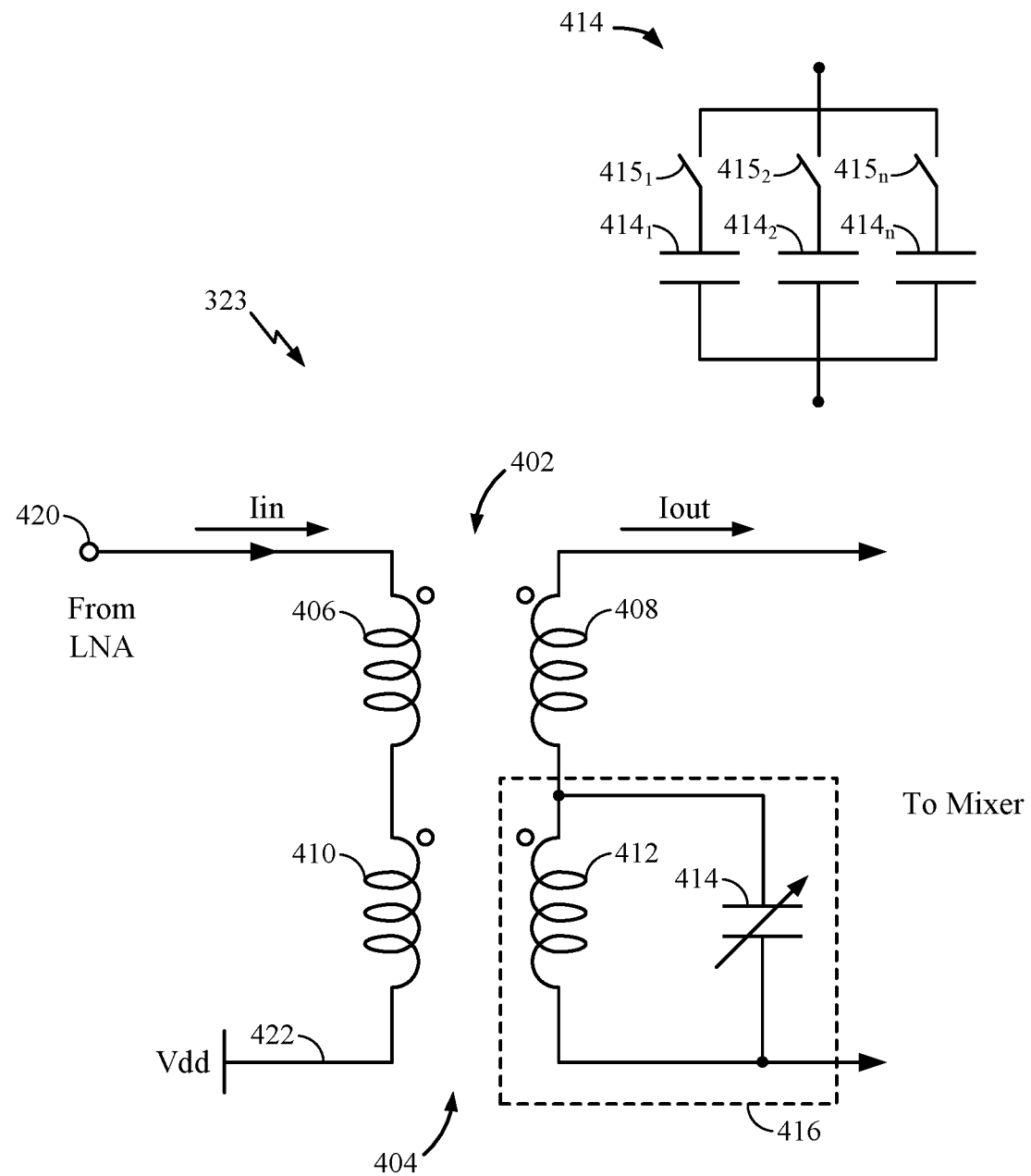
FIGS. 4A, 4B, and 4C illustrate an example circuit having transformers, in accordance with certain aspects of the present disclosure.
Figure 4B:
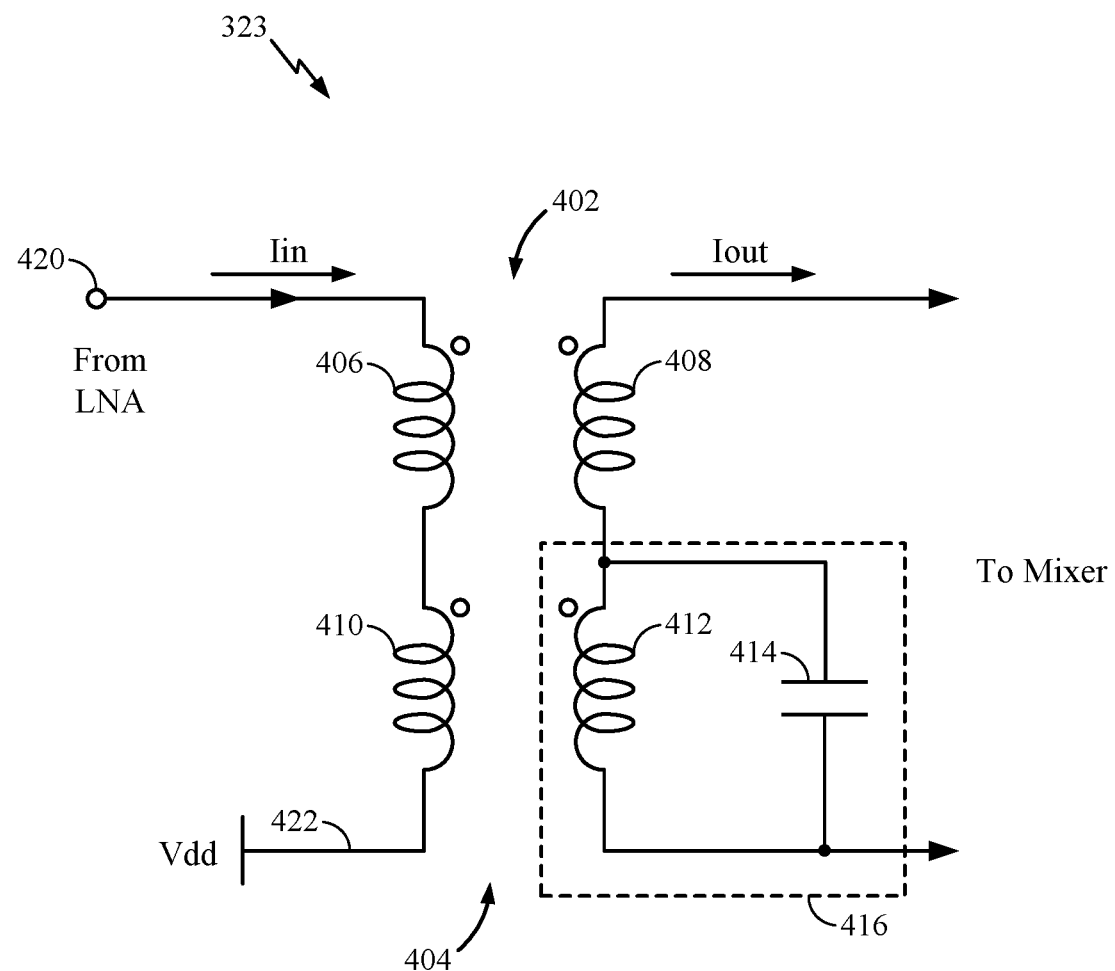

FIGS. 4A and 4B illustrate an example transformer circuit 323 having transformers 402 and 404, in accordance with certain aspects of the present disclosure. As illustrated, the transformer circuit 323 includes transformer 402 having a primary winding 406 (e.g., inductive element) that is magnetically coupled to a secondary winding 408 (e.g., inductive element). The transformer circuit 323 also includes a transformer 404 having a primary winding 410 (e.g., inductive element) that is magnetically coupled to a secondary winding 412 (e.g., inductive element). In certain aspects, the transformer 402 may have the same turn ratio as the transformer 404.

In certain aspects, the primary winding 406 and the secondary winding 408 of the transformer 402 may have the same polarity, and the primary winding 410 and the secondary winding 412 of the transformer 404 may have the same polarity, as illustrated. The primary winding 406 and the primary winding 410 are coupled in series between the node 420 at the output of the LNA and a reference potential node 422 for providing a reference voltage (e.g., Vdd).

Figure 4C:
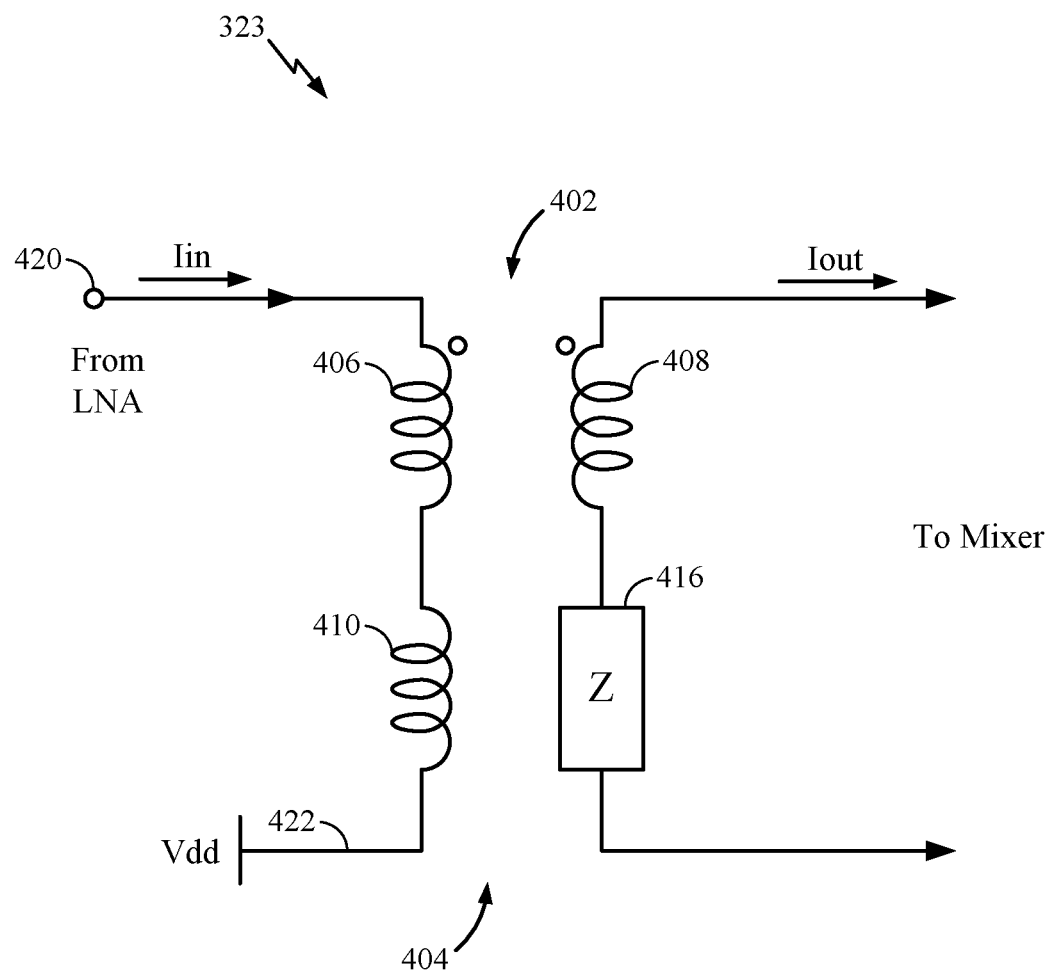

In certain aspects of the present disclosure, the secondary winding 412 may be coupled in parallel with a capacitive element 414. In certain aspects, the capacitive element 414 may have a variable capacitance, as illustrated in FIG. 4A. For example, the capacitive element 414 may be a variable capacitor such as a varactor or any tunable capacitive element. In certain aspects the capacitive element 414 may be a variable capacitive element implemented with switchable capacitive elements, such as a capacitor bank having a plurality of capacitive elements $414_1$, $414_2$, to $414_n$ and switches $415_1$, $415_2$, to $415_n$. Each of the switches $415_1$, $415_2$, to $415_n$ may be coupled in series with one of the capacitive elements $414_1$, $414_2$, to $414_n$ and the switches $415_1$, $415_2$, to $415_n$ may be controlled to adjust the overall capacitance of the capacitive element 414. In other words, a first terminal of the secondary winding 412 may be coupled to a first terminal of the capacitive element 414, and a second terminal of the secondary winding 412 may be coupled to a second terminal of the capacitive element 414. In certain aspects, the capacitive element 414 may be implemented as a fixed capacitive element, as illustrated in FIG. 4B. The secondary winding 412 and the capacitive element 414 form a notch circuit 416, as illustrated in FIG. 4C. The notch circuit 416 is coupled in series with the secondary winding 408. Implementing the capacitive element 414 with a variable capacitance allows for the tuning of the resonance frequency (e.g., 3FLO frequency) of the notch circuit 416.

The notch circuit 416 forms a high impedance signal path for a high frequency component (e.g., 3FLO frequency) of the signal applied at the node 420, increasing the rejection of the high frequency component. For example, the inductance and capacitance of the secondary winding 412 and the capacitive element 414, respectively, may be selected such that the notch circuit 416 has a resonant frequency that is equal to the 3FLO frequency, effectively implementing a 3FLO notch circuit. Thus, at the 3FLO frequency, the notch circuit 416 provides a high impedance (Z) path on the secondary side of the transformer circuit 323. For example, at the 3FLO frequency, the current conversion of the transformer circuit 323 is represented by the following equation:

$$Iout = Iin \times \frac{j\omega M}{j\omega L + Z + Rmix}$$

where Iin is the input current of the transformer circuit 323, Iout is the output current of the transformer 323, M is the coupling coefficient between the primary winding 406 and the secondary winding 408 (or the primary winding 410 and the secondary winding 412), L is the inductance of the secondary winding 408, Rmix is the load impedance (e.g., input impedance of the mixer 324 coupled to the secondary side of the transformer circuit 323), ω is the angular frequency, and Z is the equivalent impedance of the notch circuit 416. In certain aspects, the coupling coefficient M between the primary winding 406 and the secondary winding 408 may be the same as the coupling coefficient between the primary winding 410 and the secondary winding 412. Without the notch circuit 416, the current conversion gain of the transformer circuit may be represented by the following equation:

$$Iout = Iin \times \frac{j\omega M}{j\omega L + Rmix}$$

Based on the ratio of the current conversion equations presented above, the rejection of the 3FLO frequency component may be improved by a factor of:

$$\frac{Z}{Rmix}$$

when Z is substantially higher than Rmix and jwL2, which is the case when the signal applied to the notch circuit 416 has a frequency at or near the resonant frequency of the notch circuit 416. Thus, the notch circuit 416 limits the output current Iout of the transformer circuit 323 with respect to the 3FLO frequency component, increasing the 3FLO jammer signal rejection of the transformer circuit 323. While certain examples provided herein have described a circuit for rejecting the 3FLO frequency component of a signal to facilitate understanding, the circuit described herein can be used to reject any frequency component of a signal applied to the transformer circuit 323 by setting the resonant frequency of the notch circuit 416.

In certain aspects, the example transformer circuit 323 may be configured to operate across multiple frequency bands (e.g., a low-band (LB) and a mid-band (MB)). For example, the transformer 404 may be effectively shorted with respect to a MB signal component, while with respect to a low-band (LB) signal component, both transformers 402 and 404 may be operational.

FIG. 5 is a flow diagram illustrating example operations 500 for signal processing, in accordance with certain aspects of the present disclosure. The operations 500 may be performed, for example, by a transformer circuit such as the transformer circuit 323 of FIGS. 4A, 4B and 4C.

The operations 500 may begin, at block 502, by receiving an input current flowing in a first signal path, wherein the first signal path comprises a first inductive element (e.g., primary winding 406) coupled in series with a second inductive element (e.g., primary winding 410). At block 504, an output current is generated flowing in a second signal path, wherein the second signal path comprises a third inductive element (e.g., secondary winding 408) coupled to a fourth inductive element (e.g., secondary winding 412). In certain aspects, the first inductive element may be magnetically coupled to the third inductive element and the second inductive element may be magnetically coupled to the fourth inductive element. In certain aspects, the second signal path may have high impedance with respect to a first frequency (e.g., 3FLO frequency) as compared to an impedance of the second signal path with respect to a second frequency, the second frequency being lower than the first frequency.

In certain aspects, the second signal path may include a capacitive element (e.g., capacitive element 414) coupled in parallel with the fourth inductive element. In certain aspects, the operations 500 may also include setting the first frequency by setting a capacitance of the capacitive element coupled in parallel with the fourth inductive element. In certain aspects, the operations 500 may also include mixing the output current with an LO signal, where the first frequency comprises three times a frequency of the LO signal.

Figure 6A:
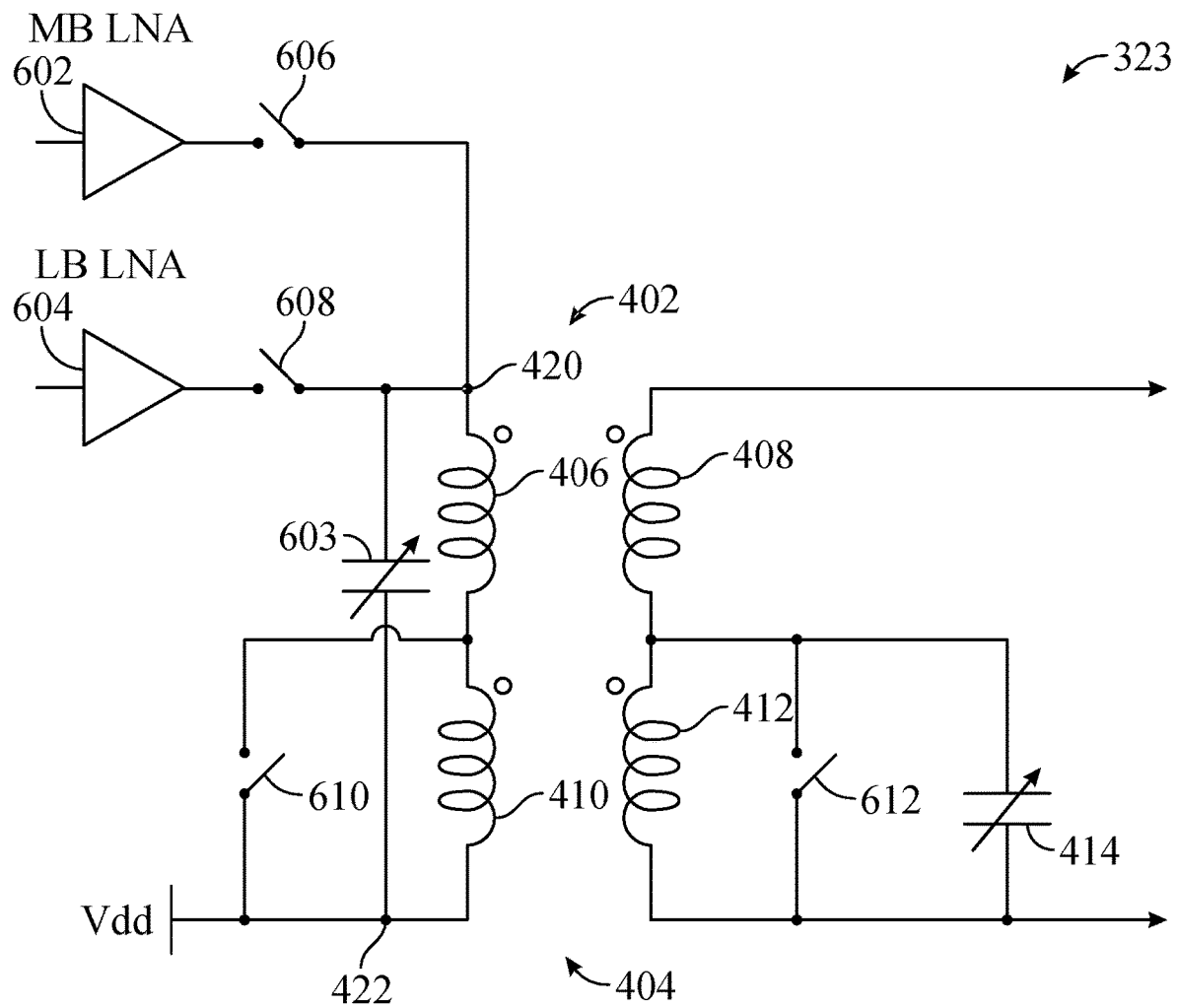
FIGS. 6A, 6B, and 6C illustrate amplifiers selectively coupled to the example circuit of FIG. 4A, in accordance with certain aspects of the present disclosure.
Figure 6B:
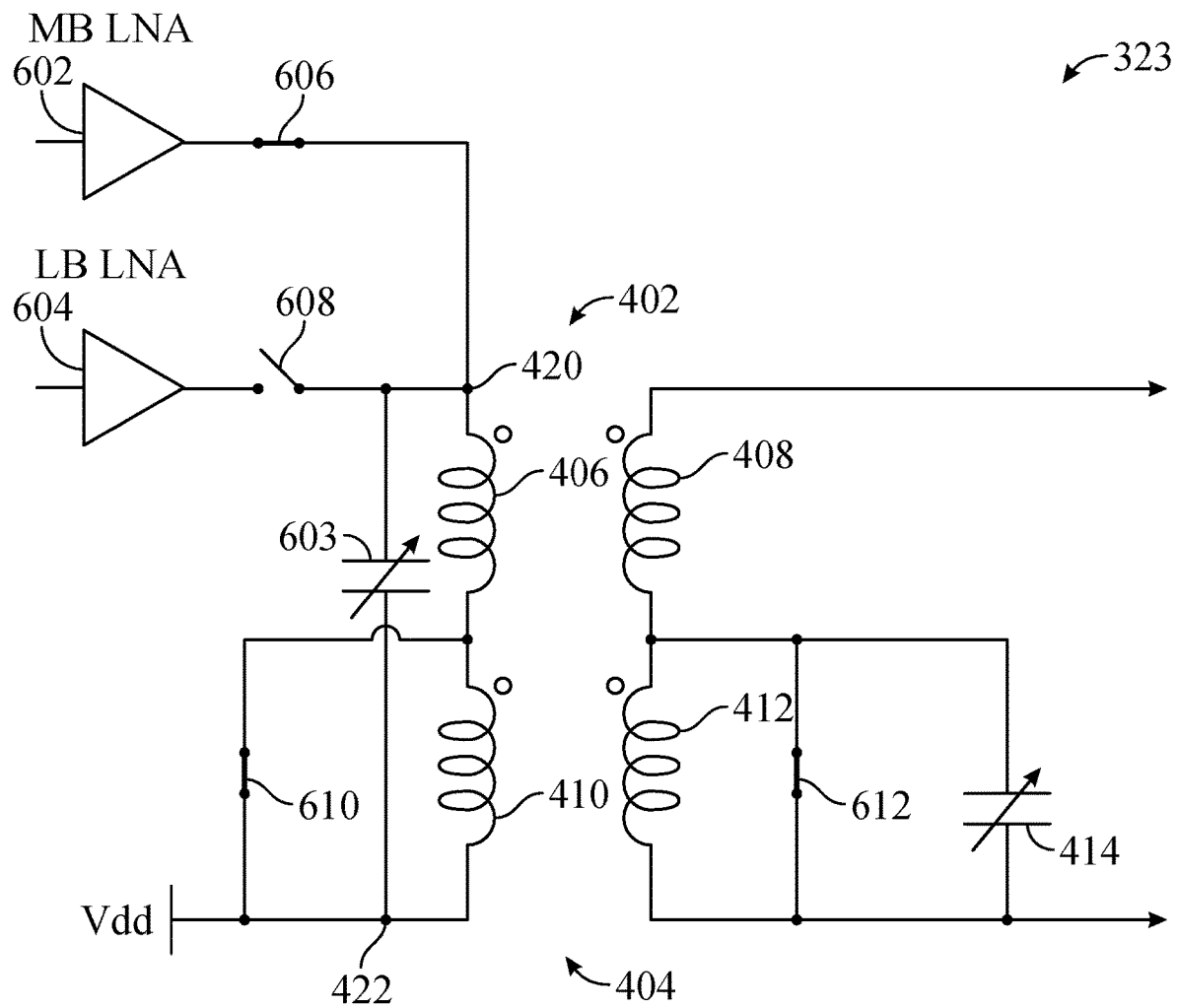
Figure 6C:
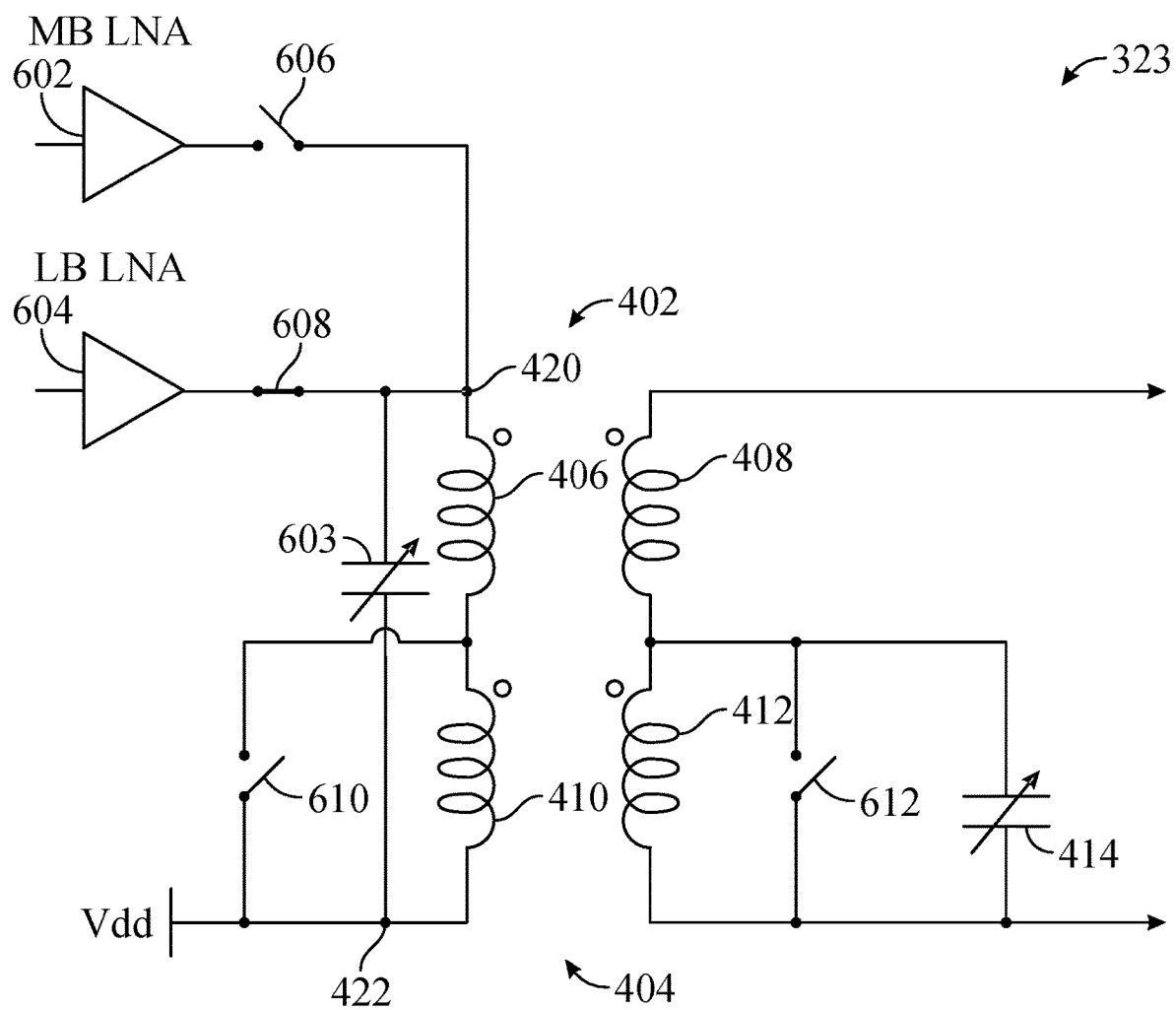

FIGS. 6A, 6B, and 6C illustrate an example circuit for processing of amplified signals, in accordance with certain aspects of the present disclosure. As illustrated, an amplifier 602 (e.g., LNA) may be used to amplify a signal having a frequency within a first frequency band (e.g. MB) during a first mode of operation (e.g., MB mode of operation) and an amplifier 604 may be used to amplify a signal having a frequency within a second frequency band (e.g., LB or 3FLO) during a second mode of operation (e.g., LB mode of operation). In certain aspects, the LB and MB may be non-overlapping frequency bands. For example, the MB may be 1800 MHz to 2 GHz, and the LB may be 725 MHz to 960 MHz. The amplifiers 602, 604 may correspond to the LNA 322 described with respect to FIG. 3. As illustrated, a switch 606, 608 may be coupled between each of the amplifiers 602, 604 and the primary winding 406, allowing the amplifiers 602, 604 to be selectively coupled, by a controller (e.g., controller 230), to the primary winding 406 depending on an active mode of operation (e.g., LB or MB mode of operation) of the wireless device. In certain aspects, a switch 610 may be coupled in parallel with the primary winding 410 and a switch 612 may be coupled in parallel with the secondary winding 412. As illustrated in FIG. 6B, during the MB mode of operation, switch 606 is closed and the switch 608 is open. Moreover, the switches 610, 612 may be closed, shorting the transformer 404 (e.g., shorting primary winding 410 and secondary winding 412) during the MB mode of operation. As illustrated in FIG. 6C, during the LB mode of operation, the switch 606 is open and the switch 608 is closed. Moreover, the switches 610, 612 may be open such that the transformers 402, 404 are in series during the LB mode of operation, as described herein with respect to FIGS. 4A, 4B, and 4C.

In certain aspects, a capacitive element 603 may be coupled between the node 420 and the reference potential node 422, allowing for the tuning of the transformer 323. For example, the capacitive element 603 may be implemented using a capacitor bank, allowing the capacitance of the capacitive element to be adjusted in order to tune the transformers 402, 404 depending on whether the MB or LB mode of operation is active. In other words, the capacitive element 603 may be a tuning capacitive element of the primary side for the combined transformers 402, 404. The capacitive element 414 may be a tuning capacitive element for the secondary side of the transformer 404 in the LB mode of operation. As described herein, the capacitive element 414 in combination with the inductive element 412 may be tuned to form the notch circuit resonance at the 3FLO.

FIG. 7 is a flow diagram illustrating example operations 700 for signal processing, in accordance with certain aspects of the present disclosure. The operations 700 may be performed, for example, by a circuit for signal processing, such as the circuit described with respect to FIGS. 6A, 6B, and 6C and/or a controller, such as the controller 230 or 280.

The operations 700 may begin, at block 702, by the controller determining whether a first mode of operation associated with a first frequency band (e.g., MB) or a second mode of operation associated with a second frequency band (e.g., LB) is active, and at block 704, controlling a first switch and second switch of a circuit for signal processing based on the determination. In certain aspects, the circuit includes a first transformer (e.g., transformer 402) having a first inductive element (e.g., primary winding 406) magnetically coupled with a second inductive element (e.g., secondary winding 408). In certain aspects, the circuit also includes a second transformer (e.g., transformer 404) having a third inductive element (e.g., primary winding 410) magnetically coupled with a fourth inductive element (e.g., secondary winding 412). The first switch may be coupled in parallel with the third inductive element, the first inductive element being coupled in series with the third inductive element when the first switch is open. In certain aspects, a capacitive element (e.g., capacitive element 414) may be coupled in parallel with the fourth inductive element, the second switch being coupled in parallel with the fourth inductive element, where the capacitive element and the fourth inductive element form a notch circuit in series with the second inductive element when the second switch is open.

In certain aspects, the first frequency band (e.g. MB) is higher than the second frequency band (e.g., LB). In this case, the controlling of the first switch and the second switch may include closing the first switch and the second switch when the second mode of operation is active. In certain aspects, a first terminal of the first inductive element is coupled to a first terminal of the third inductive element. In this case, the operations 700 may also include setting a capacitance of another capacitive element coupled between a second terminal of the first inductive element and a second terminal of the third inductive element, based on the determination. In certain aspects, the operations 700 may also include coupling (e.g., by closing switch 606) a first amplifier (e.g., amplifier 602) to the first inductive element if the first mode of operation is active, and coupling (e.g., by closing switch 608) a second amplifier (e.g., amplifier 604) to the first inductive element if the second mode of operation is active.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with discrete hardware components designed to perform the functions described herein.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A circuit for signal processing, comprising:
a first transformer having a first inductive element magnetically coupled with a second inductive element;
a second transformer having a third inductive element magnetically coupled with a fourth inductive element, wherein the first inductive element is coupled in series with the third inductive element;
a first switch coupled in parallel with the third inductive element;
a capacitive element coupled in parallel with the fourth inductive element, a notch circuit formed at least by the capacitive element and the fourth inductive element, the notch circuit coupled in series with the second inductive element; and
a second switch coupled in parallel with the fourth inductive element.

2. The circuit of claim 1, wherein the notch circuit is formed at least by the capacitive element and the fourth inductive element when the second switch is open.

3. The circuit of claim 1, wherein the first inductive element is coupled in series with the third inductive element when the first switch is open.

4. The circuit of claim 1, further comprising:
a first amplifier;
a third switch coupled between the first amplifier and the first inductive element;
a second amplifier; and
a fourth switch coupled between the second amplifier and the first inductive element.

5. The circuit of claim 4, wherein the first amplifier is configured to amplify a signal at a first frequency band, wherein the second amplifier is configured to amplify a signal at a second frequency band, the first frequency band being non-overlapping with the second frequency band.

6. The circuit of claim 5, further comprising a controller configured to set a capacitance of at least one of the capacitive element or another capacitive element coupled to the first inductive element to tune the circuit for processing of signals at the first frequency band or the second frequency band.

7. The circuit of claim 5, further comprising a controller configured to:
determine whether a first mode of operation associated with the first frequency band or a second mode of operation associated with the second frequency band is active, the first frequency band being higher than the second frequency band; and
close the first switch, the second switch, and the third switch and open the fourth switch, when the first mode of operation is active.

8. The circuit of claim 5, further comprising a controller configured to:
determine whether a first mode of operation associated with the first frequency band or a second mode of operation associated with the second frequency band is active, the first frequency band being higher than the second frequency band; and
open the first switch, the second switch, and the third switch and close the fourth switch, when the second mode of operation is active.

9. The circuit of claim 5, further comprising a mixer coupled to the second inductive element and the notch circuit, wherein the mixer is configured to receive a local oscillator (LO) signal, wherein a resonant frequency of the notch circuit is substantially three times a frequency of the LO signal.

10. The circuit of claim 1, wherein a first terminal of the first inductive element is coupled to a first terminal of the third inductive element, the circuit further comprising another capacitive element coupled between a second terminal of the first inductive element and a second terminal of the third inductive element.

11. The circuit of claim 10, wherein the other capacitive element has a variable capacitance.

12. The circuit of claim 1, wherein an equivalent impedance of the capacitive element in parallel with the fourth inductive element has higher impedance with respect to a first frequency as compared to the equivalent impedance with respect to a second frequency that is lower than the first frequency.

13. The circuit of claim 1, wherein the capacitive element has a variable capacitance.

14. The circuit of claim 13, wherein the capacitive element comprises a plurality of switchable capacitive elements.

15. The circuit of claim 1, further comprising a mixer coupled to the second inductive element and the notch circuit, wherein the mixer is configured to receive a local oscillator (LO) signal, wherein a resonant frequency of the notch circuit is substantially three times a frequency of the LO signal.

16. The circuit of claim 1, wherein a turn ratio of the first transformer is equivalent to a turn ratio of the second transformer.

17. A wireless device comprising the circuit of claim 1, the wireless device comprising:
at least one antenna; and
a receiver coupled to the at least one antenna, the receiver comprising the circuit for signal processing.

18. A circuit for signal processing, comprising:
a first inductive element magnetically coupled to a second inductive element, wherein the first inductive element is a primary winding of a first transformer, wherein the second inductive element is a secondary winding of the first transformer;
a third inductive element magnetically coupled to a fourth inductive element, wherein the third inductive element is a primary winding of a second transformer, wherein the fourth inductive element is a secondary winding of the second transformer;
a first switch coupled between a first terminal of the third inductive element and a second terminal of the third inductive element;
a second switch coupled between a first terminal of the fourth inductive element and a second terminal of the fourth inductive element, wherein a first terminal of the first inductive element is coupled to the first terminal of the third inductive element, and wherein a first terminal of the second inductive element is coupled to the first terminal of the fourth inductive element, a second terminal of the second inductive element being coupled to a first output node of the circuit, and the second terminal of the fourth inductive element being coupled to a second output node of the circuit; and
a capacitive element coupled between the first terminal and the second terminal of the fourth inductive element.

19. The circuit of claim 18, further comprising:
a first amplifier;
a third switch coupled between the first amplifier and a second terminal of the first inductive element;
a second amplifier; and
a fourth switch coupled between the second amplifier and the second terminal of the first inductive element.

20. The circuit of claim 18, further comprising one or more capacitive elements coupled between a second terminal of the first inductive element and the second terminal of the third inductive element.

21. The circuit of claim 18, wherein a notch circuit is formed at least by the capacitive element and the fourth inductive element when the second switch is open, wherein an equivalent impedance of the notch circuit has higher impedance with respect to a first frequency as compared to the equivalent impedance with respect to a second frequency that is lower than the first frequency.

22. The circuit of claim 18, further comprising a mixer coupled to the first output node and the second output node of the circuit, wherein the mixer is configured to receive a local oscillator (LO) signal, wherein a notch circuit is formed from at least the fourth inductive element and the capacitive element, the notch circuit having a resonant frequency of three times a frequency of the LO signal.

23. A method for signal processing, comprising:
determining whether a first mode of operation associated with a first frequency band or a second mode of operation associated with a second frequency band is active; and
controlling a first switch and second switch of a circuit for signal processing based on the determination, the circuit comprising:
a first transformer having a first inductive element magnetically coupled with a second inductive element;
a second transformer having a third inductive element magnetically coupled with a fourth inductive element, the first switch being coupled in parallel with the third inductive element, wherein the first inductive element is coupled in series with the third inductive element when the first switch is open; and
a capacitive element coupled in parallel with the fourth inductive element, the second switch being coupled in parallel with the fourth inductive element, wherein a notch circuit is formed at least by the capacitive element and the fourth inductive element when the second switch is open, the notch circuit being in series with the second inductive element.

24. The method of claim 23, wherein the first frequency band is higher than the second frequency band, and wherein the controlling of the first switch and the second switch comprises closing the first switch and the second switch when the first mode of operation is active.

25. The method of claim 23, wherein a first terminal of the first inductive element is coupled to a first terminal of the third inductive element, the method further comprising setting a capacitance of another capacitive element coupled between a second terminal of the first inductive element and a second terminal of the third inductive element, based on the determination.

26. The method of claim 23, further comprising:
coupling a first amplifier to the first inductive element if the first mode of operation is active; and
coupling a second amplifier to the first inductive element if the second mode of operation is active.

* * * * *